United States Patent
Kobayashi

(10) Patent No.: US 8,130,048 B2
(45) Date of Patent: Mar. 6, 2012

(54) LOCAL OSCILLATOR

(75) Inventor: Hiroyuki Kobayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 58 days.

(21) Appl. No.: 12/725,014

(22) Filed: Mar. 16, 2010

(65) Prior Publication Data

US 2011/0012684 A1 Jan. 20, 2011

(30) Foreign Application Priority Data

Jul. 16, 2009 (JP) ................................ 2009-168148

(51) Int. Cl.
*H03B 27/00* (2006.01)

(52) U.S. Cl. ................ 331/57; 331/177 V; 331/36 C; 331/1 A; 327/261; 327/264

(58) Field of Classification Search .............. 331/58, 331/1 A, 57, 177 V, 36 C; 327/261, 264
See application file for complete search history.

(56) References Cited

U.S. PATENT DOCUMENTS

| | | | |
|---|---|---|---|
| 6,633,202 B2 * | 10/2003 | Yang et al. ................. 331/57 |
| 7,859,202 B2 * | 12/2010 | Lukic et al. ................ 318/139 |
| 2008/0061894 A1 | 3/2008 | Raita et al. | |

FOREIGN PATENT DOCUMENTS

JP 2008054134 3/2008

OTHER PUBLICATIONS

Staszewski, et al.; All-Digital PLL and Transmitter for Mobile Phones, IEEE Journal of Solid-State Circuits, vol. 40, No. 12, Dec. 2005, pp. 2469-2482.

* cited by examiner

*Primary Examiner* — Arnold Kinkead
(74) *Attorney, Agent, or Firm* — Turocy & Watson, LLP

(57) ABSTRACT

Equal numbers of variable capacitance elements, capacitance values of which are separately controlled according to a logic value of a corresponding bit of a delay control signal that is in a one-to-one relation with an oscillation frequency, are connected in parallel among differential outputs of all delay circuits excluding a differential non-inverting delay circuit at the end, which extracts a frequency signal to the outside. Bits of the delay control signal are connected in a one-to-one relation to the equal numbers of variable capacitance elements arranged on output sides of all the delay circuits, in a relation in which delay control signals continuous in terms of frequency are not connected to the equal number of variable capacitance elements arranged on an output side of one of the delay circuits.

2 Claims, 1 Drawing Sheet

LOCAL OSCILLATOR

CROSS-REFERENCE TO RELATED APPLICATIONS

This application is based upon and claims the benefit of priority from the prior Japanese Patent Application No. 2009-168148, filed on Jul. 16, 2009; the entire contents of which are incorporated herein by reference.

BACKGROUND OF THE INVENTION

1. Field of the Invention

The present invention relates to a local oscillator.

2. Description of the Related Art

In an all digital phase locked loop (ADPLL) using an oscillator (a digitally controlled oscillator (DCO)) that can discretely control an oscillation frequency, a quantization error due to discretization appears in an output of the oscillator as phase noise. Therefore, in the oscillator used in the ADPLL, it is important to reduce the quantization error, i.e., reduce a variable amount of a frequency for each of control signals (control codes) that assume discrete values.

The present invention intends to realize an oscillator (DCO) used in a low-frequency ADPLL taking into account the requirements explained above and to configure the ADPLL using a ring oscillator that can be reduced in size.

A general ring oscillator controls an electric current flowing through delay circuits to change a delay amount and control an oscillation frequency. A discrete change in an oscillation frequency in such a ring oscillator can be realized by switching a current ratio in a current mirror. However, in general, a frequency variable amount of the ring oscillator with respect to an electric current is extremely large. To realize a seemingly practical frequency interval, it is necessary to control the electric current at an extremely small interval. It is likely that, if a current value is switched, noise is superimposed on a power supply to adversely affect an oscillation frequency.

For example, Japanese Patent Application Laid-open No. 2008-54134 proposes, as a method of changing a delay amount without controlling an electric current flowing through delay circuits, a method of providing variable capacitance circuits in parallel to resistor elements respectively provided between output terminals of differential amplifier circuits and a circuit ground in a ring oscillator, which includes a differential amplifier circuit, i.e., a differential non-inverting delay circuit as a delay circuit, and changing capacitance values of the respective variable capacitance circuits according to bit values of control signals of a plurality of bits. However, in this method, it is difficult to distribute uniform capacitance to the output terminals and it is impossible to secure linearity of an oscillation frequency.

SUMMARY OF THE INVENTION

According to one aspect of the present invention, a local oscillator in which three or more differential non-inverting delay circuits are connected in series, an output of a differential non-inverting delay circuit at an end is fed back, with polarity thereof changed, to an input of a differential non-inverting delay circuit at a beginning to form an oscillation ring, and a frequency signal is extracted from the differential non-inverting delay circuit at the end to an outside, wherein equal numbers of variable capacitance elements, capacitance values of which are separately controlled according to a logic value of a corresponding bit of a delay control signal that is in a one-to-one relation with an oscillation frequency, are connected in parallel among differential outputs of all the differential non-inverting delay circuits excluding the differential non-inverting delay circuit at the end, and bits of the delay control signal are connected in a one-to-one relation to the equal numbers of variable capacitance elements arranged on output sides of all the differential non-inverting delay circuits, in a relation in which delay control signals continuous in terms of frequency are not connected to the equal number of variable capacitance elements arranged on an output side of one of the differential non-inverting delay circuits.

According to one aspect of the present invention, a local oscillator in which equal numbers of variable capacitance elements, capacitance values of which are separately controlled according to a logic value of a corresponding bit of a delay control signal that is in a one-to-one relation with an oscillation frequency, are connected in parallel between output terminals of all of an even number of inverting delay circuits excluding one inverting delay circuit, which extracts a frequency signal to an outside, among an odd number of three or more inverting delay circuits connected in a ring shape and a circuit ground, wherein bits of the delay control signal are connected in a one-to-one relation to the equal numbers of variable capacitance elements arranged on output sides of all the differential non-inverting delay circuits, in a relation in which delay control signals continuous in terms of frequency are not connected to the equal number of variable capacitance elements arranged on an output side of one of the differential non-inverting delay circuits.

DETAILED DESCRIPTION OF THE INVENTION

Exemplary embodiments of the present invention are explained in detail below with reference to the accompanying drawings. The present invention is not limited by the embodiments.

Figure 1:
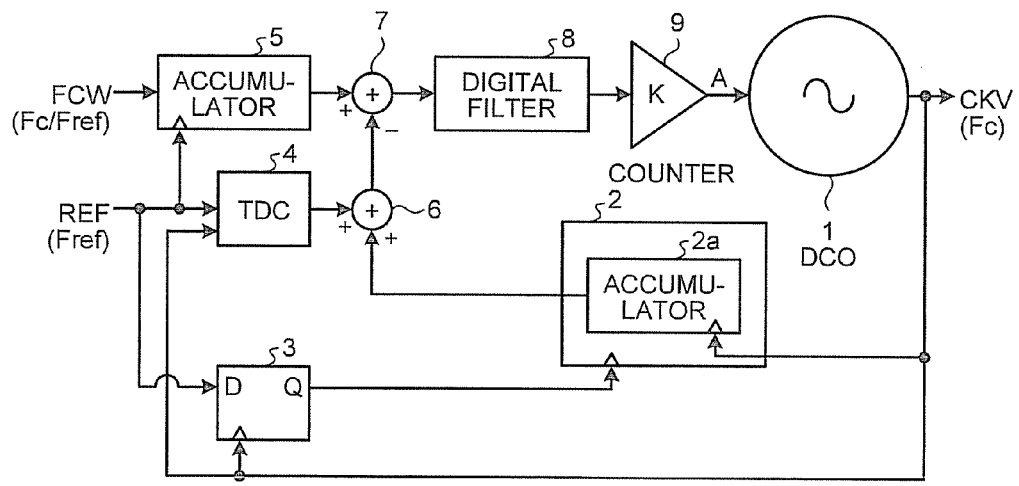
FIG. 1 is a block diagram illustrating the basic configuration of an ADPLL.
Figure 2:
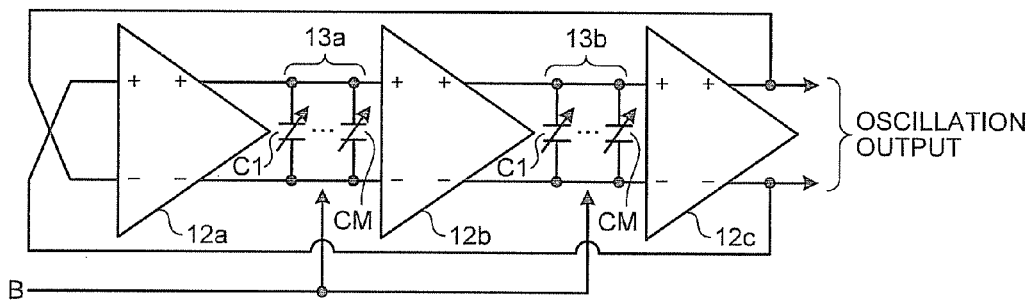
FIG. 2 is a block diagram illustrating the configuration of a local oscillator according to a first embodiment of the present invention used as a DCO shown in FIG. 1.

FIG. 1 is a block diagram illustrating the basic configuration of an ADPLL. FIG. 2 is a block diagram illustrating the configuration of a local oscillator according to a first embodiment of the present invention used as a DCO shown in FIG. 1. First, the configuration and the operation of the ADPLL are briefly explained with reference to FIG. 1.

The ADPLL shown in FIG. 1 includes a DCO 1, a counter 2, a flip-flop 3 as a retiming circuit, a time to digital converter (TDC) 4, an accumulator 5, adders 6 and 7 configuring a digital phase comparator, a digital filter 8 functioning as a loop filter, and a gain corrector 9.

The DCO 1 outputs a clock signal CKV having a frequency Fc indicated by a control code A from the gain corrector 9. The flip-flop 3 captures, in synchronization with a clock signal CKV output by the DCO 1, a reference signal REF input to a data input terminal D from the outside and outputs the synchronized reference signal REF from a data output terminal Q.

The counter 2 includes an accumulator 2a that integrates a frequency of the clock signal CKV output by the DCO 1. The counter 2 outputs an integrated value of the accumulator 2a, which is obtained when the reference signal REF synchronizing with the clock signal CKV output by the flip-flop 3 is input, to one addition input terminal of the adder 6.

The TDC 4 includes a delay circuit that delays the output clock signal CKV of the DCO 1 in multiple stages, a plurality of flip-flops that capture outputs in the respective delay stages of the delay circuit in synchronization with the reference signal REF from the outside, and a circuit that generates phase information equal to or smaller than one period of the clock signal CKV from output states of the flip-flops. The TDC 4 outputs the generated phase information equal to or smaller than one period to the other addition input terminal of the adder 6.

The adder 6 adds up the integrated value from the counter 2 and the phase information equal to or smaller than one period from the TDC 4 with the integral value set as an integer part and the phase information set as a fraction part. An addition result of the adder 6 is given to a subtraction input terminal of the adder 7 as phase information normalized by a frequency Fref of the reference signal REF. An output of the accumulator 5 is input to an addition input terminal of the adder 7.

A ratio "Fc/Fref" of the oscillation frequency Fc of the DCO 1 and the frequency Fref of the reference signal REF is input to the accumulator 5 from the outside as a frequency control word FCW. The reference signal REF is also input to the accumulator 5. The accumulator 5 time-integrates the ratio "Fc/Fref" and converts the ratio "Fc/Fref" into phase information. The accumulator 5 outputs phase information, which is obtained when the reference signal REF is input, to the addition input terminal of the adder 7 as phase control information.

The adder 7 performs subtraction of the phase control information from the accumulator 5 and the phase information from the adder 6 to generate phase error information. The digital filter 8 as a loop filter applies low-pass processing to the phase error information output by the adder 7 to generate a control value for the DCO 1. The gain corrector 9 multiplies the control value generated by the digital filter 8 with a coefficient K to generate a control code A obtained by correcting a frequency gain with respect to a control value of the DCO 1. According to repetition of the operation explained above, an oscillation frequency of the DCO 1 is controlled such that, when the ratio "Fc/Fref" is represented as n, Fc=n×Fref holds.

In FIG. 2, in a local oscillator 11 according to a first embodiment of the present invention, three differential non-inverting delay circuits 12a, 12b, and 12c are connected in series in this order, an output of the differential non-inverting delay circuit 12a at the end is fed back, with polarity thereof changed, to an input of the differential non-inverting delay circuit 12a at the beginning to form an oscillation ring, and a frequency signal is extracted from the differential non-inverting delay circuit 12c at the end to the outside. In this configuration, variable capacitance banks 13a and 13b having the same configuration are respectively provided on output sides of the differential non-inverting delay circuits 12a and 12b excluding the differential non-inverting delay circuit 12c at the end. A delay control signal B for the variable capacitance banks 13a and 13b is a control signal that is in a one-to-one relation with an oscillation frequency. The delay control signal B is generated by converting the control code A shown in FIG. 1 into a thermal code. Specifically, for example, when the control code A increases, a thermal code forming the delay control signal B is converted and generated to change from "0" to "1" in order from the right by an increase in the number of bits.

In each of the variable capacitance banks 13a and 13b, the same number of (e.g., M) variable capacitance elements C1 to CM are connected in parallel between differential outputs of the differential non-inverting delay circuits corresponding thereto. In each of the variable capacitance elements C1 to CM, for example, source terminals, drain terminals, and substrate terminals of two MOS transistors, gate terminals corresponding to differential output terminals of which are connected, are collectively connected. A capacitance value separately applied between the differential outputs can be changed by setting the potential of the collective connection end to a power supply potential or a circuit ground potential according to a logical value of a corresponding bit of the delay control signal B.

In this case, when the control code A shown in FIG. 1 indicates continuous two or more frequencies and variable delay amounts by the variable capacitance elements C1 to CM of, for example, the variable capacitance bank 13a are continuously loaded by the delay control signal B based on the frequencies, a large step portion is formed halfway in a step of an oscillation frequency that changes stepwise with respect to the control code A. This causes phase noise.

Therefore, in the configuration shown in FIG. 2, the delay control signal B is formed by, for example, two M bits. The thermal code forming the delay control signal B formed by the two M bits is generated by converting two control codes A for each of oscillation frequencies when the control code A shown in FIG. 1 is input to the local oscillator 11. The delay control signal B formed by the two M bits and the variable capacitance elements C1 to CM of each of the variable capacitance banks 13a and 13b are connected in a one-to-one relation such that the delay control signal B formed by one M bits of the delay control signal B formed by the two M bits controls the variable capacitance elements C1 to CM of the variable capacitance bank 13a and the delay control signal B formed by the other M bits controls the variable capacitance elements C1 to CM of the variable capacitance bank 13b.

Consequently, variable delay amounts by the variable capacitance elements C1 to CM of the variable capacitance bank 13a are loaded at one oscillation frequency of adjacent two oscillation frequencies and variable delay amounts by the variable capacitance elements C1 to CM of the variable capacitance bank 13b are loaded at the other oscillation frequency. In other words, a change in a delay amount in switching a frequency is dispersed to the respective delay stages. Therefore, it is possible to secure linearity of an oscillation frequency with respect to the control code A and reduce the influence of frequency control on phase noise.

Figure 3:
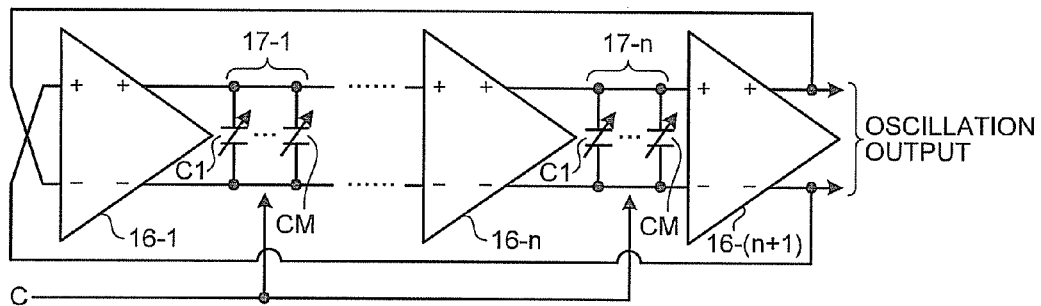
FIG. 3 is a block diagram illustrating the configuration of a local oscillator according to a second embodiment of the present invention used as the DCO shown in FIG. 1.

FIG. 3 is a block diagram illustrating the configuration of a local oscillator according to a second embodiment of the present invention used as the DCO shown in FIG. 1. In FIG. 2 (the first embodiment), the basic configuration is shown. In the second embodiment, an arbitrary number of (three or more) differential non-inverting delay circuits are used.

In FIG. 3, in a local oscillator 15 according to the second embodiment, (n+1) differential non-inverting delay circuits 16-1 to 16-(n+1) are connected in series in this order, an output of the differential non-inverting delay circuit 16-(n+1) at the end is fed back, with polarity thereof changed, to an input of the differential non-inverting delay circuit 16-1 at the beginning to form an oscillation ring, and a frequency signal is extracted from the differential non-inverting delay circuit 16-(n+1) at the end to the outside. In this configuration, variable capacitance banks 17-1 to 17-n having the same configuration are respectively provided on output sides of the differential non-inverting delay circuits 16-1 to 16-n excluding the differential non-inverting delay circuit 16-(n+1) at the end. As in the first embodiment, each of the variable capacitance banks 17-1 to 17-*n* is formed by M variable capacitance elements C1 to CM connected in parallel. A delay control signal C for the variable capacitance banks 17-1 to 17-*n* is a control signal that is in a one-to-one relation with an oscillation frequency. The delay control signal C is generated by converting the control code A shown in FIG. 1 into a thermal code.

According to a concept same as that explained in the first embodiment, the delay control signal C is formed by, for example, n×M bits. The thermal code forming the delay control signal C formed by the n×M bits is generated by converting n control codes A for each of oscillation frequencies when the control code A shown in FIG. 1 is input to the local oscillator 15. The delay control signal C formed by the n×M bits and the variable capacitance elements C1 to CM of each of the n variable capacitance banks 17-1 to 17-*n* are connected in a one-to-one relation such that delay control signals continuous in terms of frequency among the delay control signals C formed by the n×M bits control the variable capacitance elements C1 to CM of the variable capacitance banks different from one another.

Consequently, an effect same as that in the first embodiment is obtained. In addition, as in the second embodiment, if the number of delay stages in which capacitance banks are provided increases, even if power supply noise is superimposed, the power supply noise is dispersed to a plurality of delay stages. Therefore, it is possible to reduce noise superimposed on an oscillation frequency signal.

In the first and second embodiments, for convenience of explanation, it is assumed that the number of bits of the delay control signals B and C converted into the thermal codes from the control code A is equal to a total number M of the variable capacitance elements in each of the delay stages. However, the total number M of the variable capacitance elements in each of the delay stages can be larger than the number of bits of the delay control signals B and C. In this case, in the example of the delay control signal B in the first embodiment, a relation between the number of bits of the delay control signal B and the variable capacitance elements C1 to CM in each of the two delay stages is as explained below.

When the number of bits m of the delay control signal B is smaller than M, in m variable capacitance elements among the variable capacitance elements C1 to CM, the collective connection end is controlled to a power supply potential or a circuit ground potential according to a logical value of a corresponding bit of the delay control signal B. In the remaining M−m variable capacitance elements, for stability of operation, the collective connection end is connected to the power supply or the circuit ground.

In the first and second embodiments, the example of application to the ring oscillator including three or more differential non-inverting delay circuits (i.e., differential amplifier circuits) is explained. However, it goes without saying that the present invention can also be applied to a ring oscillator including an odd number of (three or more) inverting delay circuits (i.e., inverter circuits).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A local oscillator in which three or more differential non-inverting delay circuits are connected in series, an output of a first of the three or more differential non-inverting delay circuits at an end is fed back, with polarity changed, to an input of a second of the three or more differential non-inverting delay circuits at a beginning to form an oscillation ring, and a frequency signal is extracted from the first of the three or more differential non-inverting delay circuits to an outside, wherein equal numbers of variable capacitance elements, having capacitance values that are separately controlled according to a logic value of a corresponding bit of a delay control signal that is in a one-to-one relation with an oscillation frequency, are connected in parallel among differential outputs of the differential non-inverting delay circuits excluding the first of the three or more differential non-inverting delay circuits, and bits of the delay control signal are connected in a one-to-one relation to the equal numbers of the variable capacitance elements arranged on respective output sides of the three or more differential non-inverting delay circuits, in a relation in which delay control signals continuous in terms of frequency are not connected to the equal numbers of the variable capacitance elements arranged on an output side of one of the three or more differential non-inverting delay circuits, wherein the local oscillator is a digitally controlled oscillator configured to perform oscillation operation according to a control code that indicates an oscillation frequency generated from phase information detected in an all digital phase locked loop, and the delay control signal is a thermal code generated by converting the control code.

2. A local oscillator in which equal numbers of variable capacitance elements, having capacitance values that are separately controlled according to a logic value of a corresponding bit of a delay control signal that is in a one-to-one relation with an oscillation frequency, are connected in parallel between respective output terminals of an even number of inverting delay circuits excluding one of the inverting delay circuits, which extracts a frequency signal to an outside, among an odd number of three or more inverting delay circuits connected in a ring shape and a circuit ground, wherein bits of the delay control signal are connected in a one-to-one relation to the equal numbers of the variable capacitance elements arranged on output sides of the three or more inverting delay circuits, in a relation in which delay control signals continuous in terms of frequency are not connected to the equal numbers of the variable capacitance elements arranged on an output side of one of the three or more inverting delay circuits, the local oscillator is a digitally controlled oscillator configured to perform oscillation operation according to a control code that indicates an oscillation frequency generated from phase information detected in an all digital phase locked loop, and the delay control signal is a thermal code generated by converting the control code.

\* \* \* \* \*